United States Patent
Feiertag et al.

(10) Patent No.: US 8,674,498 B2
(45) Date of Patent: Mar. 18, 2014

(54) MEMS PACKAGE AND METHOD FOR THE PRODUCTION THEREOF

(75) Inventors: Gregor Feiertag, München (DE); Hans Krüger, München (DE); Alexander Schmajew, München (DE)

(73) Assignee: Epcos AG, Munich (DE)

( * ) Notice: Subject to any disclaimer, the term of this patent is extended or adjusted under 35 U.S.C. 154(b) by 263 days.

(21) Appl. No.: 12/745,613

(22) PCT Filed: Dec. 4, 2008

(86) PCT No.: PCT/EP2008/066823
§ 371 (c)(1),
(2), (4) Date: Jun. 1, 2010

(87) PCT Pub. No.: WO2009/071637
PCT Pub. Date: Jun. 11, 2009

(65) Prior Publication Data
US 2011/0006381 A1    Jan. 13, 2011

(30) Foreign Application Priority Data
Dec. 7, 2007  (DE) .................. 10 2007 058 951

(51) Int. Cl.
*H01L 23/12*    (2006.01)

(52) U.S. Cl.
USPC .... 257/704; 257/710; 257/678; 257/E23.193; 257/E23.127; 257/E23.18

(58) Field of Classification Search
USPC .......... 257/619, 678, 704, 777, E23.021, 684, 257/710, E23.193, E23.127, E23.18; 438/117, 118
See application file for complete search history.

(56) References Cited

U.S. PATENT DOCUMENTS

| 5,920,142 | A  | * | 7/1999 | Onishi et al. | 310/313 R |
| 6,403,881 | B1 | * | 6/2002 | Hughes | 174/559 |
| 6,414,415 | B1 | * | 7/2002 | Shibutani et al. | 310/313 R |

(Continued)

FOREIGN PATENT DOCUMENTS

| EP | 1433742 A2 | 6/2004 |
| EP | 1405822 A2 | 7/2004 |

(Continued)

OTHER PUBLICATIONS

Goetz M. et al., Chip Scale Packaging Techniques for RF SAW Devices, 27. annual IEEE/CPMT/SEMI Int. Electronics Manufacturing Technology Symposium; Dated 2002; (4 pages).

(Continued)

*Primary Examiner* — Hoai V Pham
(74) *Attorney, Agent, or Firm* — Nixon & Peabody LLP

(57) ABSTRACT

An MEMS package is proposed, wherein a chip having MEMS structures on its top side is connected to a rigid covering plate and a frame structure, which comprises a polymer, to form a sandwich structure in such a way that a closed cavity which receives the MEMS structures is formed. Solderable or bondable electrical contact are arranged on the rear side of the chip or on the outer side of the covering plate which faces away from the chip, and are electrically conductively connected to at least one connection pad by means of an electrical connection structure.

16 Claims, 6 Drawing Sheets

(56) References Cited

U.S. PATENT DOCUMENTS

| | | | |
|---|---|---|---|
| 6,446,316 B1 | 9/2002 | Furbacher et al. | |
| 6,448,635 B1 | 9/2002 | Glenn | |
| 6,495,398 B1 * | 12/2002 | Goetz | 438/117 |
| 6,530,515 B1 | 3/2003 | Glenn et al. | |
| 6,655,834 B1 * | 12/2003 | Frey et al. | 374/179 |
| 6,713,314 B2 * | 3/2004 | Wong et al. | 438/25 |
| 6,784,535 B1 * | 8/2004 | Chiu | 257/704 |
| 6,809,412 B1 * | 10/2004 | Tourino et al. | 257/678 |
| 6,859,542 B2 | 2/2005 | Johannsen et al. | 381/174 |
| 6,929,974 B2 | 8/2005 | Ding et al. | |
| 6,984,421 B2 | 1/2006 | Pahl et al. | |
| 7,037,844 B2 | 5/2006 | Dache et al. | |
| 7,129,576 B2 | 10/2006 | Humpston | |
| 7,142,682 B2 | 11/2006 | Müllenborn et al. | 381/322 |
| 7,234,237 B2 | 6/2007 | Franosch et al. | |
| 7,239,023 B2 | 7/2007 | Yu-Tung et al. | |
| 7,447,323 B2 | 11/2008 | Mullenborn et al. | 381/174 |
| RE40,781 E | 6/2009 | Johannsen et al. | 381/174 |
| 7,548,626 B2 | 6/2009 | Stenberg et al. | 381/113 |
| 7,630,504 B2 | 12/2009 | Poulsen | 381/111 |
| 7,634,096 B2 | 12/2009 | Fallesen | 381/113 |
| 7,792,315 B2 | 9/2010 | Müllenborn et al. | 381/175 |
| RE42,346 E | 5/2011 | Rombach et al. | 381/174 |
| RE42,347 E | 5/2011 | Rombach et al. | 381/174 |
| 8,036,401 B2 | 10/2011 | Poulsen et al. | 381/113 |
| 8,094,846 B2 | 1/2012 | Hovesten et al. | 381/312 |
| 8,097,483 B2 | 1/2012 | Van Schaijk et al. | 438/52 |
| 8,103,025 B2 | 1/2012 | Mullenborn et al. | 381/174 |
| 8,143,967 B2 | 3/2012 | Schmidhammer | 333/17.3 |
| 8,170,249 B2 | 5/2012 | Halteren | 381/322 |
| 8,259,963 B2 | 9/2012 | Stenberg et al. | 381/113 |
| 8,284,966 B2 | 10/2012 | Wilk et al. | 381/189 |
| 8,295,528 B2 | 10/2012 | Rombach et al. | 381/369 |
| 8,305,069 B2 | 11/2012 | Bouwman et al. | 323/313 |
| 8,305,136 B2 | 11/2012 | Schmidhammer | 327/554 |
| 8,330,667 B2 | 12/2012 | Boyle | 343/750 |
| 2001/0022404 A1 * | 9/2001 | Yamamoto et al. | 257/783 |
| 2002/0076910 A1 | 6/2002 | Pace | |
| 2002/0101129 A1 * | 8/2002 | Grade et al. | 310/309 |
| 2004/0255670 A1 | 12/2004 | Silverbrook | |
| 2005/0062167 A1 | 3/2005 | Huang et al. | |
| 2005/0167795 A1 * | 8/2005 | Higashi | 257/678 |
| 2006/0001123 A1 * | 1/2006 | Heck et al. | 257/528 |
| 2007/0018301 A1 | 1/2007 | Fukuda et al. | |
| 2007/0096295 A1 * | 5/2007 | Burtzlaff et al. | 257/704 |
| 2007/0096312 A1 | 5/2007 | Humpston et al. | |
| 2007/0181979 A1 * | 8/2007 | Beer et al. | 257/619 |
| 2007/0190747 A1 * | 8/2007 | Humpston et al. | 438/460 |
| 2007/0194418 A1 * | 8/2007 | Suminoe | 257/678 |
| 2007/0295456 A1 * | 12/2007 | Gudeman et al. | 156/379.7 |
| 2008/0090427 A1 * | 4/2008 | Humpston et al. | 439/66 |
| 2009/0184424 A1 * | 7/2009 | Furusawa et al. | 257/758 |
| 2009/0214061 A1 | 8/2009 | Johansen et al. | 381/174 |
| 2010/0176895 A1 | 7/2010 | Schmidhammer | 333/32 |
| 2010/0176899 A1 | 7/2010 | Schäufele et al. | 333/187 |
| 2010/0213819 A1 * | 8/2010 | Cok et al. | 313/498 |
| 2010/0237962 A1 | 9/2010 | Schmidhammer | 333/26 |
| 2011/0006381 A1 | 1/2011 | Feiertag et al. | 257/416 |
| 2011/0110536 A1 | 5/2011 | Hovesten et al. | 381/111 |
| 2011/0114355 A1 | 5/2011 | Bauer et al. | 174/50.5 |
| 2011/0133315 A1 | 6/2011 | Pahl et al. | 257/659 |
| 2011/0170714 A1 | 7/2011 | Hanzlik et al. | 381/111 |
| 2011/0180885 A1 | 7/2011 | Pahl et al. | 257/415 |
| 2011/0230068 A1 | 9/2011 | Pahl | 439/65 |
| 2011/0233690 A1 | 9/2011 | Feiertag et al. | 257/414 |
| 2011/0298064 A1 | 12/2011 | Pahl et al. | 257/415 |
| 2012/0093346 A1 | 4/2012 | Feiertag et al. | 381/174 |
| 2012/0224726 A1 | 9/2012 | Pahl | 381/174 |
| 2012/0225259 A1 | 9/2012 | Mortensen et al. | 428/195.1 |
| 2012/0235735 A1 | 9/2012 | Spits et al. | 330/126 |
| 2012/0275634 A1 | 11/2012 | Leidl et al. | 381/369 |
| 2012/0299131 A1 | 11/2012 | Henn | 257/416 |
| 2012/0326249 A1 | 12/2012 | Rombach | 257/416 |

FOREIGN PATENT DOCUMENTS

| | | | |
|---|---|---|---|
| JP | 06-318625 | 11/1994 | |
| JP | 2004-209585 | 7/2004 | |
| JP | 2005-251898 | 9/2005 | |
| JP | 2006-517339 | 7/2006 | |
| JP | 2006-275660 | 10/2006 | |
| JP | 2007-000994 | 1/2007 | |
| JP | 2007-017199 A | 1/2007 | |
| JP | 2007-042741 | 2/2007 | |
| JP | 2007-516602 | 6/2007 | |
| JP | 3938199 B1 | 6/2007 | |
| WO | 2004025727 A1 | 3/2004 | |
| WO | WO/2006/102351 A1 | 9/2006 | |
| WO | 2008066087 A1 | 6/2008 | |
| WO | 2011/092137 | 8/2011 | B81C 1/00 |
| WO | 2011/107159 | 9/2011 | H03F 3/193 |
| WO | 2011/144570 | 11/2011 | H04R 19/00 |

OTHER PUBLICATIONS

Lin et al., Encapsulation of Film Bulk Acoustic Resonator Filters Using a Wafer-Level Microcap Array, Journal of Micromechanics and Microengineering 15; Dated 2005; (6 pages).

Japanese Office Action corresponding to counterpart Japanese Patent Application No. 2010-536462; Dated Mar. 26, 2013; (3 pages).

* cited by examiner

Fig 7C

MEMS PACKAGE AND METHOD FOR THE PRODUCTION THEREOF

CROSS-REFERENCE TO RELATED APPLICATIONS

This application is a U.S. National Stage of International Application No. PCT/EP2008/066823, filed Dec. 4, 2008, which claims the benefit of Germany Patent Application No. 102007058951.6, filed on Dec. 7, 2007, both of which are incorporated herein by reference in their entireties.

MEMS components (Micro Electro Mechanical System) generally require a cavity housing, such that their mechanically movable component structures are not impeded with regard to their activity. For SAW (Surface Acoustic Wave), FBAR (Thin Film Bulk Acoustic Resonator) and other MEMS components, it is possible in this case to use a flip-chip arrangement, wherein the chip is connected to a substrate by means of bumps. A cavity is formed between substrate and chip and thus protects the component structures.

Cavity housings without a substrate are required for further miniaturization, said housings enabling a further miniaturization of the housing dimensions and, in particular, of the component height.

It is an object of the present invention, therefore, to specify an MEMS package which permits a further miniaturization and which can be produced in a simple manner.

This object is achieved by means of an MEMS package comprising the features of claim 1. Advantageous configurations of the invention emerge from further claims.

It is proposed that, in contrast to the situation heretofore, the required cavity housing is not formed principally by means of a flip-chip process, wherein the cavity is formed between a chip and a mechanically stable substrate. Rather, an MEMS package is proposed, wherein a matched covering is produced on the chip carrying MEMS structures on its top side, said covering producing a cavity between chip and covering.

The covering substantially consists of a relatively rigid covering plate having a modulus of elasticity of at least 20 GPa and a frame structure, which comprises a polymer and which is arranged between the top side of the chip and the covering plate in such a way that a closed cavity which receives the MEMS structures is formed.

The electrical connections for the MEMS component are provided on an outer side of the MEMS package. Thus, solderable or bondable electrical contacts can be arranged either on the rear side of the chip or on the outer side of the covering plate which faces away from the chip, said electrical contacts being electrically conductively connected to the at least one connection pad of the MEMS component by means of one or a plurality of electrical connection structures.

The covering plate having the relatively high modulus of elasticity ensures, even in the case of a relatively small thickness of less than 100 μm, for example, a sufficient bearing capacity even with respect to a molding process wherein the package is encapsulated with a plastic composition at the module stage, that is to say after fixing on a printed circuit board or an intermediate carrier. The package proposed, even in the case of the abovementioned layer thickness of less than 100 μm of the covering plate, is stable with respect to high pressures of, for example, up to 150 bar in conjunction with high temperatures of up to 200 degrees Celsius. The component functions and, in particular, the undisturbed mobility of the micromechanical components are not disturbed here. Highly suitable and advantageous layer thicknesses of the covering plate are between 10 μm and 150 μm.

The package proposed can be produced in a wafer assemblage, and be produced as a genuine wafer level package.

The material of the frame structure comprises a polymer and has, by comparison with the covering plate, a lower modulus of elasticity of at most 5 GPa, which is low enough to compensate, if appropriate, for stresses occurring between chip and covering plate within the frame structure. The residual elasticity of the frame structure also ensures a certain pressure insensitivity vertically with respect to the chip surface since the frame structure can still absorb slight deformations.

The covering plate is composed of a rigid material or comprises a rigid material selected from glass, ceramic, crystalline or polycrystalline compounds or semiconductors. Criteria for the selection of a suitable material for the covering plate may be: the thermal behavior, the price, the availability, the structureability and processability and also mechanical stability and compatibility with the chip material.

In order to avoid short circuits, the covering plate comprises at least one layer of an electrically insulating or semi-conducting material or is produced exclusively from such a material.

In order to prevent thermal strains from building up during temperature changes, the covering plate and the chip are preferably produced from the same material. An MEMS component that operates with acoustic waves on a substrate composed of lithium tantalate, lithium niobate or quartz therefore forms, together with a covering plate composed of the corresponding same material, an advantageous MEMS package that is largely insensitive to thermal strains. An MEMS component on the basis of silicon, germanium or ceramic can likewise advantageously be encapsulated with a covering place produced from the same material to form an MEMS package according to the invention.

The frame structure composed of polymer is preferably optimized with regard to processability, in particular with regard to simple application and patterning. The frame structure is advantageously constructed from a photopatternable material, preferably a photoresist, which can be patterned directly by exposure and development. In this case, the material for the frame structure can be applied in liquid or pasty form and be planarized, if appropriate. It is also possible, however, to apply a photopatternable film, in particular by lamination. For patterning purposes, the photoresist applied over the whole area can be exposed in scanning fashion and, by way of example, using a laser. It is also possible, however, to use an imaging optical method, in particular exposure by means of a mask.

The contacts of the package can be arranged at the outer side of the covering plate. In this case, the connection structures can be led in the form of metallizations around the side edge of the covering plate. It is also possible, however, to lead the connection structures through the covering plate. In this case, it is advantageous to provide corresponding holes in the covering plate beforehand or to drill or to etch holes after the production of the cavity and then to fill them with a conductive material.

The holes are advantageously provided in the region of the frame structure in order not to cause additional lack of tightness of the cavity with the MEMS structures and hence an additional source of penetrating moisture which could promote corrosion of the MEMS structures.

However, the contacts can also be arranged on the underside of the chip, that is to say on the outer side of the chip which lies opposite the MEMS structures. The electrical connection structures are then preferably led around the side edges of the chip. Connection structures through the chip are indeed possible, but not usually advantageous.

The connection structure between the connection pads arranged on the chip within the cavity and the electrical connects arranged on an outer side of the MEMS package can comprise a conductor track. The latter is applied either on the top side of the chip or on the inner side of the covering plate and accordingly runs between the respective surface and the frame structure out of the cavity.

A situation in which the connection structure is reliably contact-connected to a metallization on the surface of the chip is promoted if the edge of the covering plate is drawn back relative to the edge of the chip, such that, in a plan view of the covering plate, a narrow strip of the chip surface remains visible at at least one edge. A part of the connection structure can then be applied both to this marginal region and to the covering in a simple manner. In this case, it is possible to produce the electrical contacts on the covering plate from the metallization of the connection structure and together with the latter.

Analogously, however, the edge of the chip can also be drawn back relative to the edge of the covering plate. In the case of an arrangement of the contacts on the rear side of the chip, the connection structures can then be applied both to the rear side of the chip and to the underside or inner side of the covering plate, said underside or inner side being uncovered in the region of at least one edge.

In the two cases with a drawn-back edge, for the production of the connection structures on two different planes preference is given to application methods which simultaneously also enable the vertical sections of the connection structure to be produced, in order to electrically conductively bridge the level difference from the top side of the chip to the outer side of the covering plate or, respectively, from the underside of the covering plate onto the rear side of the chip.

The connection structures can be produced in one or a plurality of steps. In particular, it is possible, before the production of the package, to apply sections of the connection structures on a surface of the chip and/or the covering plate and, in a subsequent step, additionally to produce the sections of the connection structure which connect the two planar sections.

The vertical sections of the connection structure can also be arranged in part in the interior of the cavity and, in particular, run along the inwardly facing edges of the frame structure. This is possible, for example, by means of a suitable metallization of the frame structure and subsequent patterning.

The mechanical stability of the covering plate makes it possible to produce metallizations patterned to form passive component structures on the inner surface of the covering plate which faces the cavity and to electrically interconnect them with the MEMS component or the component structures on the chip. Conductor tracks, resistors, capacitances and inductances can be realized with these passive component structures.

Particularly in the case of a package wherein the chip and the covering plate consist of the same material, it is also possible to realize more complex component structures on that surface of the covering plate which faces the cavity. If the MEMS component is, for example, an electroacoustic component with a piezo-substrate, a covering plate composed of a piezo-material can be used and likewise provided with electroacoustic structures, which can then likewise be arranged within the cavity and thus protected.

It is advantageous if the frame structure of the MEMS package forms an additional step between the covering plate and the chip, such that the outer edge of the frame structure therefore projects under the outer edge of the chip or the covering plate. In such a variant, a portion of the connection structures can also be applied on this projecting frame structure edge.

In a further variant, at least one of the abovementioned edges has a multiply curved or multiply bent course along the edge actually provided or around said edge. A higher processing reliability is obtained in this way since the relative lateral arrangement of the two edges with respect to one another is now possible with a higher tolerance. Even if the two edges then intersect once or a number of times, a situation is nevertheless made possible in which at least one portion of the projecting or drawn-back edge is uncovered in plan view and accessible to a coating with sections of a connection structure.

In a further variant it is possible to produce the frame structure from a material that exhibits good electrical conduction anisotropically, to be precise only vertically with respect to the chip surface. This enables an exclusively vertical current conduction through the frame structure, such that a plurality of current paths of the connection structure can be led in a parallel manner through the frame structure without said current paths having to be insulated from one another, since laterally there is only low or no conductivity at all.

Such a frame structure allows metallizations on the underside of the covering plate to be electrically conductively connected to those on the chip surface. The remaining vertical section of the connection structure through to the electrical contacts on an outer surface can then be implemented either around the edges or through chip or covering plate. The latter option is possible in a simpler manner in the case of an electrically conductive frame since the holes in the covering plate can then be produced with greater tolerance with respect to the depth. The corresponding drilling through the covering plate can then end at any desired height within the frame structure and nevertheless produce an electrically conductive connection in all cases.

An electrically anisotropically conductive frame structure can comprise a preferably compressible, electrically insulating polymer filled with electrically conductive particles. In the production method, this material can then be compressed uniaxially in such a way that, between conductive particles, along the axis in which pressure was exerted, the electrical conduction is produced by means of a pressure contact.

In a further configuration, supporting structures can be arranged within the region surrounded by the frame structure, that is to say within the cavity, said supporting structures being supported at covering plate and chip. Said supporting structures can be embodied in pillar form or in the form of webs and are supported at the chip in those regions which do not bear mechanically movable or oscillating component structures. They are preferably produced together with the frame structure and produced from the same material. This makes it possible even for packages having a relatively large area to be mechanically stabilized without the occurrence of a collapse of the covering plate in the center of the area enclosed by the frame structure and hence contact with or damage to the MEMS component structures.

In the case of the MEMS package proposed it is advantageous to cover metallic component structures on the top side of the chip, or generally metallic component structures running in the interior of the cavity, with a preferably thin passivation layer having a layer thickness of e.g. less than 5 µm, and in particular less than 100 nm. The passivation layer can comprise an inorganic material that is additionally applied to the component structures by means of a corresponding layer forming method. However, it is also possible for the surface of metallic component structures to be chemically reactively altered and converted into an electrically insulating surface layer in the process. For this purpose, oxides and nitrides, in particular, are suitable, which can be produced for example in an oxygen- or nitrogen-containing plasma acting on the metallic component structures. However, it is also possible to alter metallic component structures anodically or reactively at the surface by means of ion bombardment and thus to produce a passivation layer.

Component structures provided with a passivation layer have an increased stability with respect to corrosion and lead to a longer service life of the component.

It is also possible to increase the corrosion resistance of the MEMS component by providing the frame structure with an inorganic coating that inhibits the diffusion of moisture. Such a coating is preferably applied at least to the outer or inner side of the frame structure. By way of example, the frame structure can firstly be produced on a surface, in particular on the chip surface, and then subsequently be provided with such a moisture-inhibiting coating. If the latter is applied over the whole area, then it can be removed again at least in the region of the component structures in a subsequent patterning process. However, it is also possible to apply a whole-area passivation layer both to the component structures and to the frame structure and to leave it there in order to further increase the moisture-tightness of the MEMS package.

The functionality of the MEMS package can be increased further if a thermal pad having a largest possible area and serving for heat dissipation is furthermore additionally applied on the outer area having the contacts. Said pad can serve solely for heat dissipation and is preferably likewise connected to a metallization during the mounting of the MEMS package onto a substrate, a printed circuit board or a circuit environment. The thermal pad does not require any electrical connection to a component structure for this purpose. However, it is possible to connect the thermal pad to a ground connection of the component and to effect the ground connection of the MEMS package to the external circuit environment by means of the thermal pad.

The heat dissipation from the MEMS package is further facilitated if thermal vias are provided, which are preferably led through the covering plate. Such vias can lead in bundles in a parallel fashion through chip or covering plate and connect a heat generator to a heat sink arranged outside the MEMS package, e.g. to a metallization having a high heat capacity, which can be arranged on a printed circuit board, for example. The thermal vias can also end in the cavity enclosed between chip and covering plate and can dissipate heat that accumulates there. They can be electrically conductive and connected to a potential, e.g. to ground potential, or be without any electrical connection to the MEMS structure.

The invention is explained in greater detail below on the basis of exemplary embodiments and the associated figures. The figures serve solely for illustrating the invention and have therefore been drawn up such that they are only schematic and not true to scale. Therefore, neither absolute nor relative dimensional indications can be inferred from the figures.

FIGS. 7A to 7K show various method stages in the production of an MEMS package in accordance with a first exemplary embodiment.

FIGS. 8A to 8K show various method stages of a second exemplary embodiment in schematic cross section.

Figure 1:
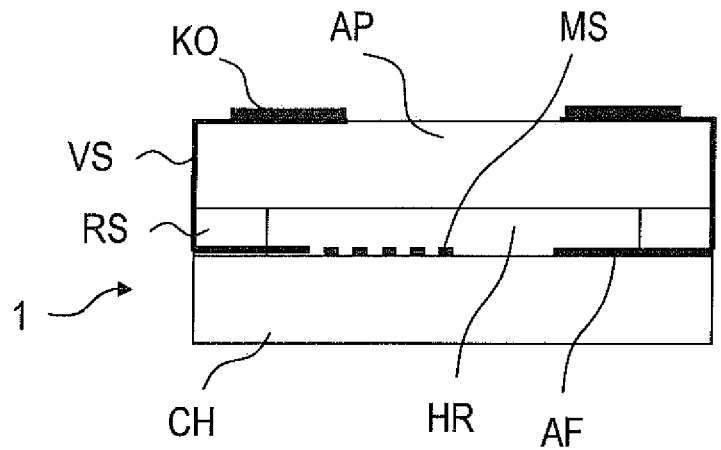
FIG. 1 shows an MEMS package in schematic cross section wherein electrical connection structures are led from the surface of the chip outside the cavity over the edge of the covering through to contacts on the rear side of the covering.

FIG. 1 shows an MEMS package 1 in schematic cross section. The MEMS component can be of any desired type and of any desired structure. What are common to all embodiments, however, are the chip CH, preferably composed of a crystalline material, MEMS structures MS applied on the surface of the chip CH, and electrical connection pads for making contact with the MEMS structures MS, said electrical connection pads likewise being arranged on the surface of the chip. The MEMS package comprises a covering plate AP, which, together with the chip CH and a frame structure RS arranged in between, in a sandwich design, produces a fixed assemblage. The frame structure follows the edges of the chip or the covering plate and bears fixedly on chip and covering plate. It encloses the MEMS structures MS and in this case forms a cavity HR that receives the MEMS structures MS.

The MEMS package 1 has electrical contacts KO on the outer side of the covering plate AP, said electrical contacts being connected to the connection pads AF of the chip by means of a connection structure VS. In the embodiment in accordance with FIG. 1, the connection structure, beginning at the connection pad, is led around the frame structure and the outer edge of the covering plate upward onto the top side of the covering plate. The outer edges of covering plate, frame structure and chip are illustrated as flush in the figure. However, it is also possible for the chip and/or the frame structure to project laterally below the covering plate in this configuration of the connection structure.

Figure 2:
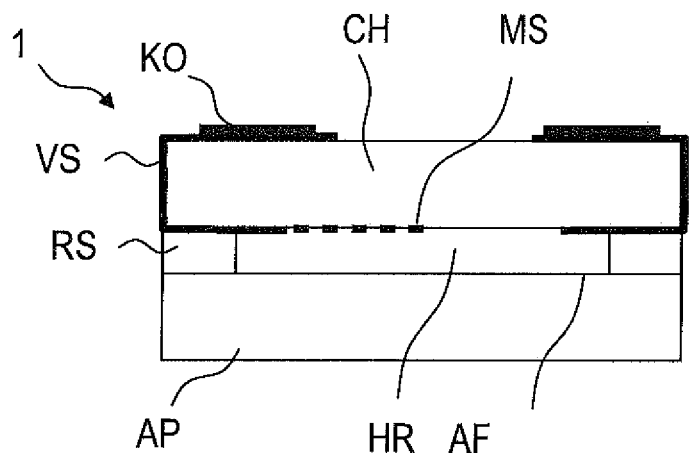
FIG. 2 shows an MEMS package in schematic cross section wherein the connection structures are led around the edge of the chip onto the rear side of the chip to the contacts.

FIG. 2 shows an embodiment wherein the contacts KO are arranged on the rear side of the chip CH. The electrical connection structures run from the top side of the chip, said top side bearing the MEMS structures MS and the connection pads AF, around the outer edge of the chip through to the contacts KO. The connection structures VS and contacts KO can be constructed in single-layered fashion, and in particular in multilayered fashion. The contacts KO can be reinforced in relation to the connection structures VS and have, in particular, a bondable or solderable layer.

Figure 3:
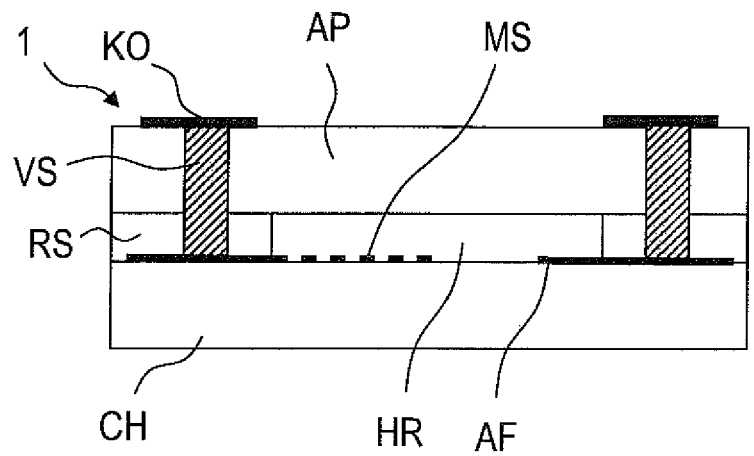
FIG. 3 shows an MEMS package wherein the connection structures are led from the chip through the frame structure and the covering plate to the contacts on the rear side of the covering plate.

FIG. 3 shows a further embodiment of an MEMS package 1 in schematic cross section. In this case, the contacts KO are again arranged on the outer side of the covering plate AP. The connection between contacts KO and connection pads AF on the top side of the chip CH is effected by means of plated-through holes running through the covering plate AP and the frame structure RS to the connection pad AF arranged below the frame structure (between frame structure and chip). Since the connection structure embodied in the form of a plated-through hole is led through the frame structure RS, the cavity HR remains closed off. The plated-through holes through the covering plate can be produced before the application of the covering plate or after the production of the sandwich and can be filled with a conductive material. This variant has the advantage that the frame structure, at least along its complete outer edge, can bear tightly both on the top side of the chip CH, which is planar there, and on the inner side of the covering AP without the sealing of the cavity HR being interrupted by electrical conductor tracks or connection structures running below the frame structure. The plated-through hole through the frame structure RS or that part of the connection structure VS which leads vertically through the frame structure RS can be obviated if the frame structure is established such that it is anisotropically electrically conductive and has a current conductivity exclusively perpendicularly to the surface of the chip. An anisotropic conductivity is realized for example by means of a frame structure having an electrically insulating plastic matrix into which electrically conductive particles are embedded. The particle sizes are advantageously adapted to the height of the frame structure. As an alternative, an electrically conductive connection of particles arranged one above another is produced by compression of the frame structure perpendicularly to the surface.

Figure 4:
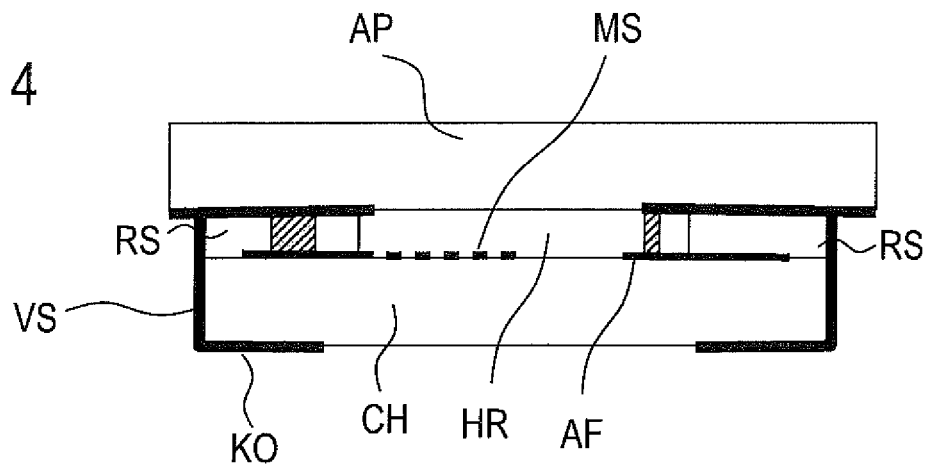
FIG. 4 shows an MEMS package in schematic cross section wherein the electrical connection structures are led from the chip through the frame structure onto the inner side of the covering and outside the cavity over the chip edge through to contacts on the underside of the chip.

FIG. 4 shows an embodiment of an MEMS package wherein the contacts KO are arranged on the rear side of the chip CH. However, the connection structures VS comprise a section which leads from the top side of the chip, and beginning there from the connection pads AF, firstly onto the inner side of the covering plate AP. On the inner side of the covering plate AP, the connection structure runs "below" the frame structure RS through toward the outside and is led over the frame and the outer edge of the chip CH through to the contacts KO. As illustrated on the left in the figure, the section of the connection structure VS from the top side of the chip as far as the inner side of the covering plate can be effected by means of a plated-through hole within the frame structure RS. However, it is also possible to produce contact structures above the connection pads AF, which contact structures enable a connection transversely through the cavity. Such contact structures can be embodied in the form of bumps or patterned metallizations, as is illustrated by way of example in the right-hand part of FIG. 4. The contact structures can be embodied for example in pillar or web form.

Figure 5:
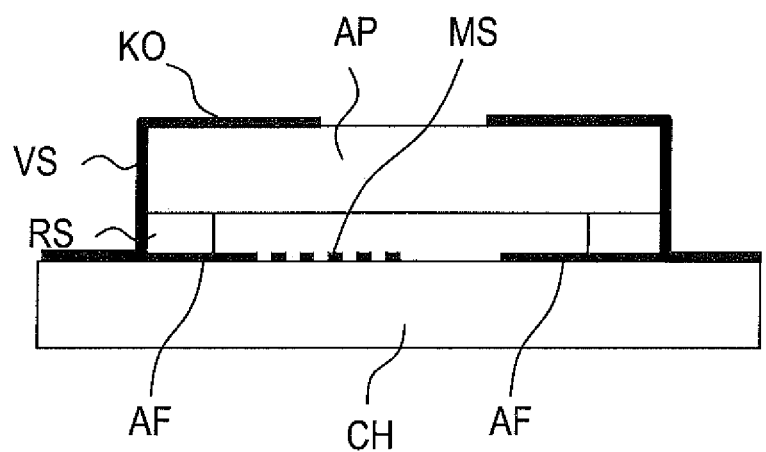
FIG. 5 shows an MEMS package in schematic cross section wherein the connection structures are arranged in a manner similar to that in FIG. 1, but the chip edge projects beyond the covering plate.

FIG. 5 shows a further embodiment, wherein the frame structure RS is seated on the top side of the chip CH in such a way that at least parts of the connection pad AF on the top side of the chip remain outside the frame structure. The connection structures VS connect the connection pad around the outer edge of the covering plate AP to the contacts KO on the outer side of the covering plate. This embodiment is distinguished by the fact that the electrically conductive connection between connection pads and connection structure can be produced more simply, for example by means of a metallization method by which vertical edges can also be metallized and patterned.

Figure 6:
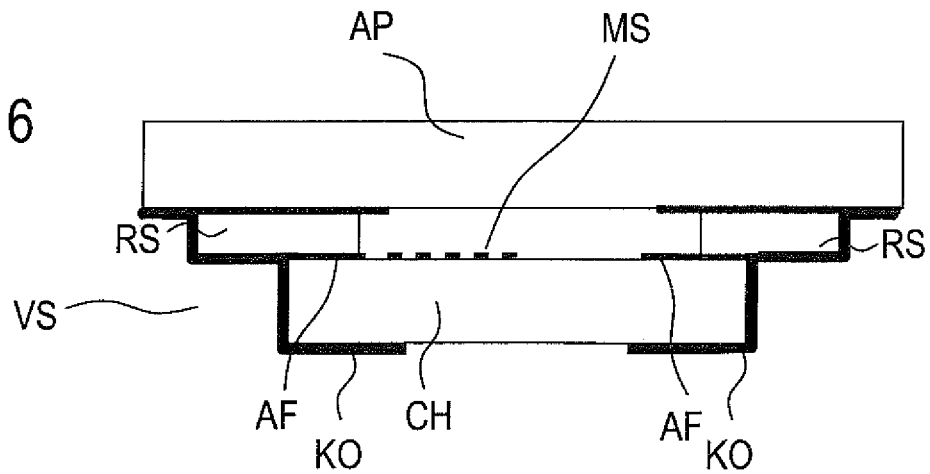
FIG. 6 shows an MEMS package in schematic cross section wherein the contacts are arranged on the underside of the chip and wherein the outer edge of the covering plate projects beyond the chip.

FIG. 6 shows a further embodiment, wherein the outer edge of the covering plate AP projects beyond the frame structure RS, and the frame structure projects beyond the chip edge, thus resulting in a stepped arrangement. The contacts KO are arranged on the rear side of the chip CH. In this case, the connection structures VS comprise a section which bears on that surface of the frame structure RS which faces downward in the figure. Furthermore, it is optionally possible, as illustrated in FIG. 6, to apply electrically conductive structures on the inwardly facing surface of the covering plate AP and to lead them between frame structure and covering plate through to the projecting edge of the covering plate AP. In this way, it is possible to lead connection structures both through to the connection pads AF of the chip and to metallizations on the inner side of the covering plate AP and to connect them to separate or common contacts KO on the rear side of the chip CH.

FIG. 7 shows an exemplary method for the production of an MEMS package on the basis of cross sections during different method stages. FIG. 7a shows the excerpt—comprising an MEMS chip—of an MEMS wafer CW with MEMS structures applied thereon. The MEMS structures are electrically connected by means of connection pads AF on the surface of the chip. The method can also be carried out with an individual MEMS chip. However, the method is advantageously carried out at the wafer level, a multiplicity of identical or different MEMS components being produced in parallel alongside one another in a component wafer CW. In FIG. 7a, an SAW component (Surface Acoustic Wave) is indicated, the MEMS structures MS of which are embodied for example as interdigital transducers or reflectors in the form of correspondingly patterned metallizations.

Per MEMS component, a frame structure RS is then produced on the surface of the component wafer CW, said frame structure enclosing the MEMS structures MS of a respective MEMS component.

Figure 7A:
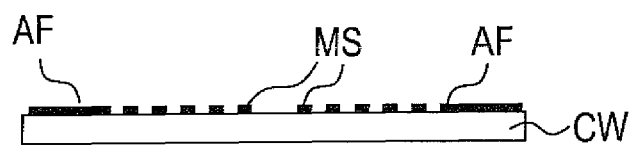
Figure 7B:
Figure 7D:
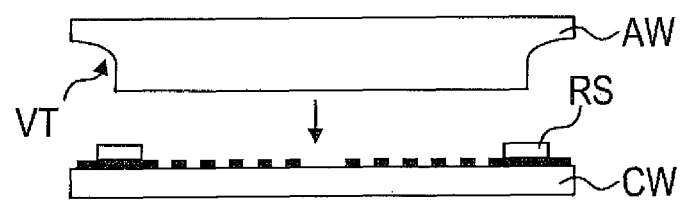

The frame structure is preferably a polymer that is electrically insulating or anisotropically electrically conductive. The polymer can be applied by printing, applied by stamping or applied in patterned fashion by means of a jet printing method. It is also possible to produce the frame structure from a whole-area polymer layer by means of phototechnological patterning or by direct patterning using a laser. FIG. 7b shows an excerpt from the component wafer CW in the region of an individual component with applied frame structure RS.

In order to cover the MEMS structures MS by means of a covering plate, a covering wafer AW corresponding to the size of the component wafer is provided. Said covering wafer can already have a pattern of depressions VT on its surface facing the component wafer CW, said pattern being arranged in the region of the subsequent separating lines between the individual MEMS components and thus patterning the sections assigned to individual covering plates. In this case, the covering wafer AW has a thickness that is greater than the thickness of the subsequent covering plate. It consists of at least one layer of a sufficiently rigid material and comprises at least one electrically insulating layer. Such a covering wafer AW in accordance with FIG. 7c is then connected to a chip wafer CW in accordance with FIG. 7d in such a way that the underside of the covering wafer is seated all round on the frame structure RS and forms a closed cavity HR in this case.

Covering wafer AW and frame structure RS can be connected using an adhesive, which is applied either selectively in the region of the subsequent connection contact area on the underside of the covering wafer AW, over the whole area on the underside of the covering wafer or selectively on the top side of the frame structure RS. An adhesive which cures or incipiently cures under UV radiation is preferably used for this purpose. This has the advantage that it has a sufficiently long processing time without exposure to radiation and begins to cure only after activation by means of UV radiation. A further advantage when using an adhesive which cures under UV radiation is that it is possible to work at room temperature. Different coefficients of thermal expansion then do not lead to stresses and hence to warpages of the wafer assemblage after cooling.

If chip wafer and covering wafer consist of the same material or differ by less than 3 ppm/K, the adhesive bonding can also be effected using a thermally curing adhesive. The adhesive layer can be applied to the frame or the covering wafer, for instance by stamping, screen printing or spraying. The polymer material of the frame structure can also be directly thermally adhesively bonded to the covering wafer. For this purpose, it is advantageous for the polymer to be only partly polymerized or cured prior to adhesive bonding.

Figure 7E:
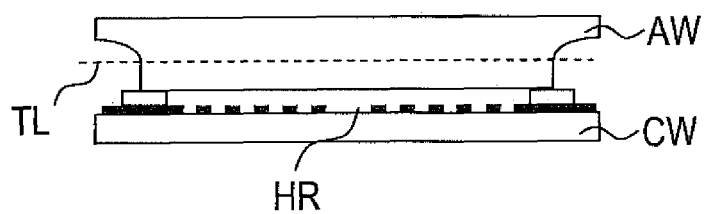

FIG. 7e shows the arrangement after the covering wafer AW has been placed onto the frame structure RS.

Figure 7F:
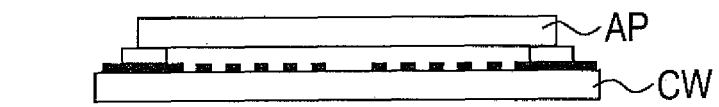

In the next step, the connection pads AF on the top side of the component wafer CW are uncovered through the covering wafer. For this purpose, in a simple manner, the covering wafer can be removed, and in particular ground away, from above as far as a separating line TL (see FIG. 7e). In this case, the pattern of depressions is opened from the rear side of the covering wafer, at least one portion of a connection pad AF becoming accessible from above in each depression. It is also possible for the depressions in the covering wafer to have a grid corresponding to the frame structure RS, such that the covering wafer AW has been singulated into individual covering plates AP after the grinding-away process. FIG. 7f shows the arrangement after singulation.

In a departure from singulation by grinding away, it is also possible to use a planar covering wafer AW and to singulate the latter from the rear side after it has been placed onto the frame structure of the chip wafer. This can be done by sawing, by wet or dry etching or by sandblasting. In these cases, it is advantageous to cover the connection pads AF with the aid of a patterned polymer before chip wafer and covering wafer are connected, in order to protect said connection pads during the singulation process.

FIG. 7f can accordingly illustrate an excerpt from the component region of an MEMS component wherein either openings have been opened in the covering wafer AW above the individual connection pads or (as illustrated) the covering wafer has already been singulated into individual covering plates AP allocated to each MEMS component.

In the next step, a base metallization GM is applied over the whole area onto the uncovered regions of the chip wafer CW and onto the rear side of the covering plate AP and the uncovered regions of the frame structure RS. This can be done using a thin-film method by means of sputtering, for example. A sputtered titanium/copper base metallization GM is highly suitable, for example.

Figure 7G:
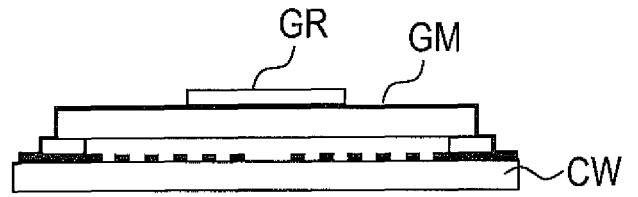

In the next step, an electroplating resist GR is applied and patterned in such a way that those regions of the base metallization which are not intended to be reinforced to the final metallization thickness are covered. FIG. 7g shows the arrangement at this method stage.

Figure 7H:
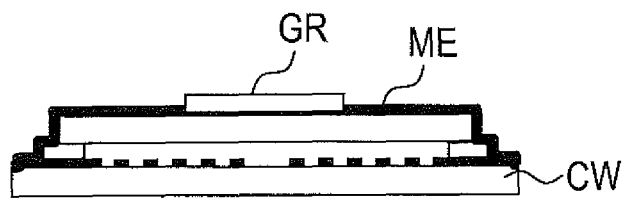

The base metallization is subsequently reinforced by metal deposition in the regions not covered by electroplating resist GR. This can be effected in electroless fashion or electrolytically. Copper and nickel layers are highly suitable; they provide for a good conductivity and can be deposited in a simple manner. A gold layer can be applied as the topmost layer. FIG. 7h shows the arrangement at this method stage with the metallization ME, the thickness of which corresponds at least to the desired thickness of the subsequent connection structures VS.

Figure 7J:
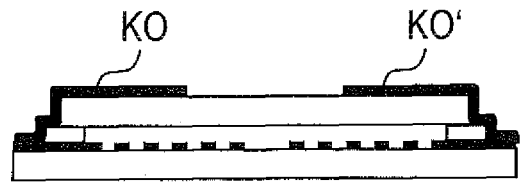

In the next step, the electroplating resist GR is removed and the base metallization uncovered underneath is removed by etching. FIG. 7j shows the arrangement at this method stage. As a result of the patterning with the electroplating resist, two contact areas KO and KO' have been separated from one another here, by way of example.

In the next step it is possible to pattern the surface that can be wetted by solder. For this purpose, with the aid of a photoresist, the readily wettable surface layer (e.g. gold layer) of the metallization ME can be patterned such that it remains only at the locations at which bumps or solder balls are to be applied in the next step. As an alternative, it is also possible to produce the bumps with the aid of a patterned resist layer having, at the locations provided for the bumps, openings in which the metallization ME, and in particular the surface layer thereof that can be wetted with solder, is uncovered.

Figure 7K:
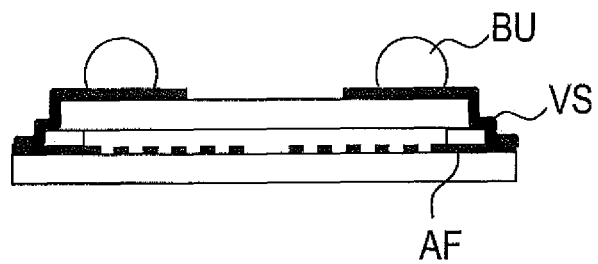

FIG. 7k shows the arrangement after the production of the bumps BU. The bumps BU applied over the contacts KO are electrically conductively connected to the connection pads AF on the top side of the chip or of the component wafer by means of the metallization ME that has been patterned to form the connection structure VS. In this way, the MEMS structures MS are also electrically connected and can be connected to a circuit environment by means of the bumps.

In the last step, the component wafer is singulated into the individual MEMS components, wherein sawing, etching, grounding or sandblasting can be used as the separating process. It is also possible to induce a fracture along the separating lines between the individual MEMS components by means of laser radiation if the component wafer has already been sufficiently reduced in thickness at this location by means of a mechanical method.

FIG. 8 shows various method stages in accordance with a second exemplary embodiment on the basis of schematic cross sections through an MEMS component. In this example, the MEMS chip is covered with a covering plate AP, which likewise has component structures at its surface facing the chip. Said component structures can be identical in type to the MEMS structures of the MEMS chip. However, it is also possible to form, on the inner side of the covering plate, passive component structures, in particular coils, capacitors or delay lines, which can be produced in the form of a correspondingly patterned metallization.

Figure 8A:
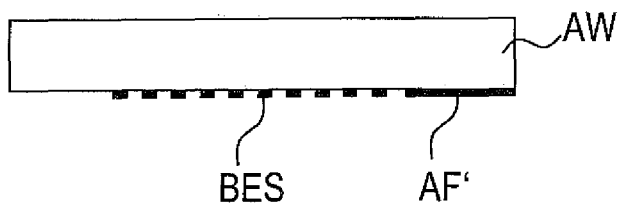

FIG. 8a shows, by way of example, a schematic cross section through a covering wafer AW having a multiplicity of component regions in which the component structures BES provided for an MEMS component are respectively arranged. In order to make contact with the component structures BES, per component region, connection pads AF' in the form of planar metallizations are formed on the surface of the covering wafer AW (see FIG. 8a).

In the next step, the component structures BES are covered with a protective film SF, which preferably consists of an organic material that can be patterned in a simple manner. However, other, in particular inorganic, protective films SF that can be stripped away again are also suitable.

Figure 8B:
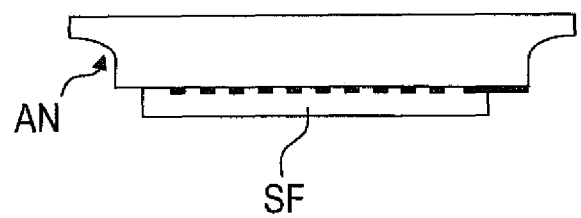

In the next step, the covering wafer is incised or subjected to sawing along the boundaries between the component regions from the underside bearing the component structures, advantageously as far as half the thickness of the covering wafer AW. FIG. 8b shows the arrangement at this method stage.

Figure 8C:
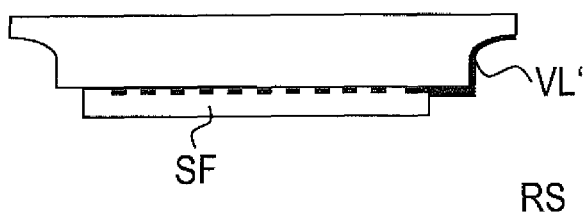
Figure 8D:
Figure 8E:
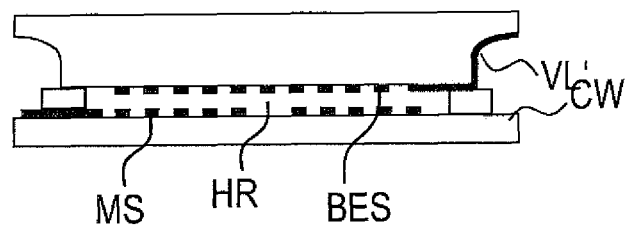

In the next step, a metallization is applied over the whole area onto the underside of the covering wafer and patterned with the aid of lithography, thus giving rise to connecting lines VL' extending from the connection pads AF' on the underside of the covering wafer AW right into the recesses AN. The recesses follow e.g. the separating lines between the component regions. FIG. 8c shows the arrangement after the patterning of the connecting conductors VL'. FIG. 8d shows in schematic cross section in a component region of a component wafer, which can be prepared in accordance with the first exemplary embodiment (see FIG. 7b in that case). In the next step, the protective film SF is removed and the covering wafer is placed onto the component wafer in such a way that the planar underside of the covering wafer, per component region, is seated all around on the frame structure RS and encloses a cavity between component and covering wafer. A fixed connection to the frame structure is subsequently produced, for which purpose a suitable bonding method is used. It is also possible to adhesively bond the covering wafer onto the frame structure. Moreover, it is possible to melt the frame structure and to produce a fusible connection to the covering wafer. FIG. 8e shows the arrangement at this method stage, wherein both the component structures BES and the MEMS structures MS are enclosed in the cavity.

Figure 8F:
Figure 8G:
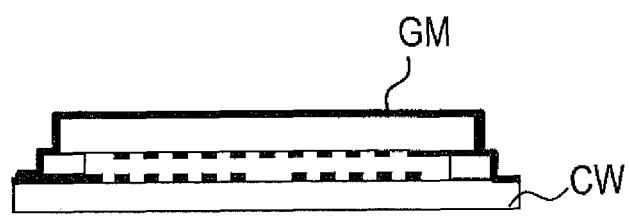
Figure 8H:
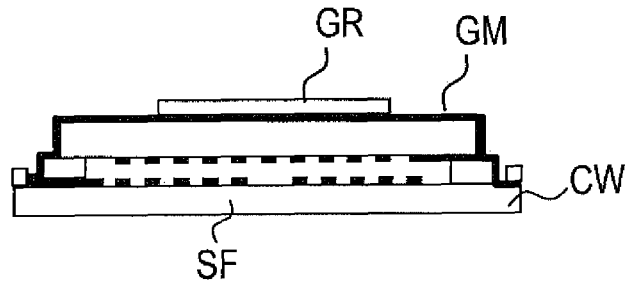

In the next step, the covering wafer AW is singulated into the individual covering plates per component region. For this purpose, the covering wafer can be ground away again as in the first exemplary embodiment, in which case the depressions or recesses AN prefabricated along the separating lines between the covering plates are uncovered from above. FIG. 8f shows a component with a singulated covering plate AP having been placed thereon.

Figure 8J:
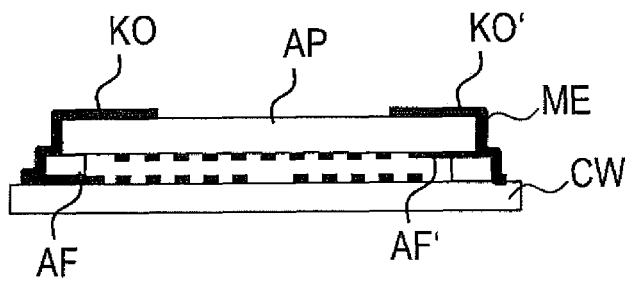

This is followed by the production and patterning of a metallization. For this purpose, as in the first exemplary embodiment, firstly a base metallization is applied over the whole area over the whole area onto the rear side of the covering plate and the uncovered surface of the frame structure and the component wafer CW. The patterning can again be effected using an electroplating resist GR that covers regions of the base metallization GM which are not to be reinforced. After the base metallization has been thickened to the final layer thickness of the metallization ME, the electroplating resist GR and the base metallization still present in this region are removed, said metallization being removed by etching. FIG. 8j shows the arrangement at this method stage. The illustration shows two patterned contacts KO, KO' which are electrically conductively connected to the connection pad AF on the component wafer CW and, respectively, to the connection pad AF' on the underside of the covering plate AP.

This is followed by the selective application of bumps BU, for which purpose once again as in the first exemplary embodiment the topmost layer of the metallization ME, which is a gold layer wetting with solder, for example, is removed apart from the locations at which the bumps BU are intended to be applied. It is also possible to apply a resist that cannot be wetted with solder, and to pattern it in such a way that openings arise in which the surface of the metallization ME that can be wetted with solder is uncovered. The bumps themselves can be applied by printing or applied electrolytically. The bumps can also be applied as prefabricated balls and be connected to the contacts by melting.

Figure 8K:
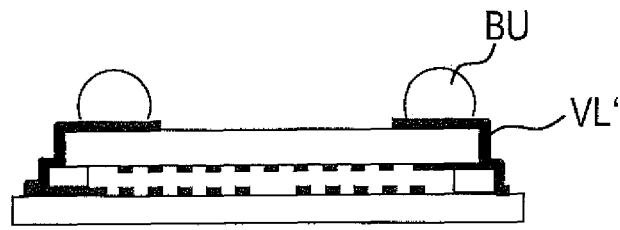

In the last step, the MEMS components are singulated by means of corresponding cuts being led through the chip wafer along the separating lines between the individual component regions. FIG. 8k shows a finished component in schematic cross section.

Figure 9:
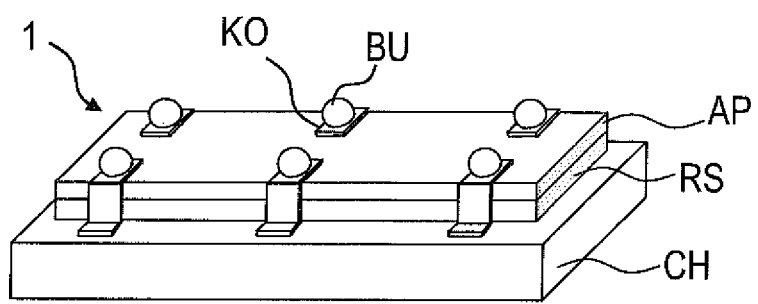
FIG. 9 shows an MEMS package in perspective plan view.

FIG. 9 shows an exemplary component in a perspective plan view of the covering plate AP. In the embodiment illustrated, six contacts KO are provided for the MEMS package, said contacts either all being electrically conductively connected to the MEMS structures or else in part being electrically conductively connected to component structures BES on the underside of the covering plate. The number of contacts KO provided with bumps BU is dependent on the type of component. In the simplest case, two contacts KO suffice to make contact with an MEMS component encapsulated in an MEMS package. Particularly in the case of components which operate with acoustic waves it is advantageous to provide a plurality of contacts for ground connections.

The MEMS package illustrated in FIG. 9 corresponds here to the exemplary embodiment illustrated in cross section in FIG. 5.

Figure 10:
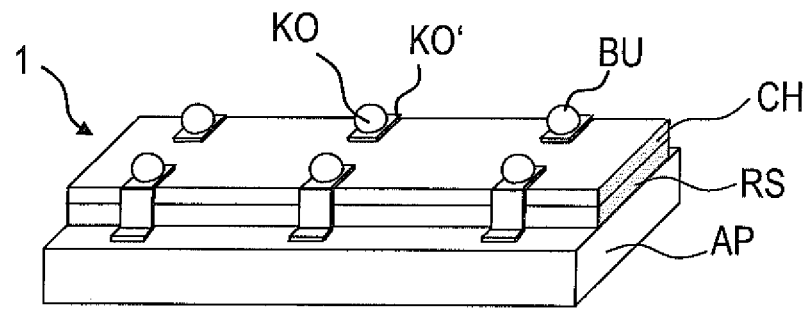
FIG. 10 shows a further MEMS package in perspective plan view.

FIG. 10 represents an exemplary embodiment which can be obtained by interchanging the arrangement of covering plate AP and chip CH. In this case, the contacts KO are arranged on the rear side of the chip and the edges of the covering plate project beyond the chip edges. The outer edges of the frame structure are flush with the corresponding edges of the chip CH and the covering plate at least at two edges.

The exemplary embodiments wherein the outer edges of the frame structure are flush neither with the chip edges nor with the edges of the covering plate lead to a component similar to that illustrated in FIG. 9. In this case, the only difference is that the connection structures VS are led from the surface of the chip CH by way of a further step, formed by the frame structure RS, onto the top side of the covering plate AP. The same correspondingly holds true for embodiments wherein the connection structures VS are led from the surface of the covering plate over the edge of the frame structure onto the surface of the chip CH to the contacts KO arranged there.

The invention is not restricted to the embodiments illustrated in the figures. In particular, any desired variations arise for the geometrical configuration and/or the base area of chip and covering plate. The rectangular variant is advantageous merely with regard to the better utilization of the wafer base area. The edges of chip and/or covering plate do not even have to run in a rectilinear fashion and do not even have to run at right angles with respect to one another, and nor do the outer edges of the frame structure; in one exemplary embodiment, said frame structure can have a multiply curved or angled course.

LIST OF REFERENCE SYMBOLS

1 MEMS package
AF Electrical connection pad on top side of CH
AN Recess
AP Covering plate
AW Covering wafer
BES Component structures
BU Bump
CH Chip
CW Chip wafer
GM Base metallization
GR Electroplating resist
HR Cavity
KO Electrical contacts
ME Metallization
MP Package for MEMS
MS MEMS structures
RS Frame structure
TL Separating line
VS Connection structure
VT Depression

What is claimed is:
1. An MEMS package
comprising at least one chip having MEMS structures and at least one electrical connection pad on its top side,
comprising a covering plate having side edges and a modulus of elasticity of at least 20 GPa,
comprising a frame structure, which comprises a polymer and the material of which has a modulus of elasticity of at most 5 GPa and which is arranged between the chip and the covering plate in such a way that a closed cavity which receives the MEMS structures is formed, comprising solderable or bondable electrical contacts
arranged on the outer side of the covering plate which
faces away from the chip,
comprising an electrical connection structure, which electrically conductively connects the at least one connection pad to the contacts,
wherein the connection structure is led around the side edges of the covering plate,
wherein, at at least one side of the MEMS package, the edge of the covering plate is drawn back relative to the edge of the chip,
wherein the connection structures bear at least in part on the top side of the chip and on the outer side of the covering plate, and
wherein the connection structure is made by metallization and includes a conductor track applied on the top side of the chip, the conductor track extending between a respective surface of the chip and the frame structure out of the closed cavity.

2. The MEMS package as claimed in claim 1, wherein the covering plate comprises at least one layer of a rigid, electrically insulating or semiconducting material selected from glass, ceramic, crystalline or polycrystalline compounds or semiconductors.

3. The MEMS package as claimed in claim 1, wherein the covering plate consists of the same material as the chip.

4. The MEMS package as claimed in claim 1, wherein the frame structure is constructed from a photopatternable material.

5. The MEMS package as claimed in claim 1, wherein the connection structures comprise a section which is led through the frame structure.

6. The MEMS package as claimed in claim 1, wherein chip and covering plate are produced from lithium tantalate.

7. The MEMS package as claimed in claim 1, wherein the frame structure has a corresponding bent course relative to a top surface of the chip facing the frame structure or relative to a bottom surface of the covering plate facing the frame structure.

8. The MEMS package as claimed in claim 1, wherein supporting structures are arranged within the cavity enclosed by the frame structure, said supporting structures being supported at the covering plate and the chip.

9. The MEMS package as claimed in claim 1,
wherein electrically conductive metallic component structures are arranged on the top side of the chip,
wherein the component structures are covered with a passivation layer.

10. The MEMS package as claimed in claim 9, wherein the thickness of the passivation is at most 100 nm.

11. The MEMS package as claimed in claim 1, wherein an inorganic coating which inhibits the diffusion of moisture is applied to the inwardly and/or outwardly facing side area of the frame structure.

12. The MEMS package as claimed in claim 1, wherein a large-area thermal pad serving for heat dissipation is additionally applied on the outer area of the package which has the contacts.

13. The MEMS package as claimed in claim 12, wherein the thermal pad is connected to thermal vias led through the chip or through the covering plate.

14. The MEMS package as claimed in claim 1, wherein the MEMS structures realize components selected from SAW components, FBAR components, micromechanical acceleration sensors, gyro sensors, microphones and pressure sensors.

15. The MEMS package as claimed in claim 1, wherein the package lacks any electrical contact extending through the frame spacer between the chip and the covering plate.

16. The MEMS package as claimed in claim 1, wherein the connection structure contacts the side edges of the covering plate as the connection structure is led around the side edges thereof.

* * * * *